(12) United States Patent
Shieh et al.

(10) Patent No.: US 9,520,437 B2
(45) Date of Patent: Dec. 13, 2016

(54) FLEXIBLE APS X-RAY IMAGER WITH MOTFT PIXEL READOUT AND A PIN DIODE SENSING ELEMENT

(71) Applicants: Chan-Long Shieh, Paradise Valley, AZ (US); Gang Yu, Santa Barbera, CA (US)

(72) Inventors: Chan-Long Shieh, Paradise Valley, AZ (US); Gang Yu, Santa Barbera, CA (US)

(73) Assignee: CBRITE INC., Goleta, CA (US)

( * ) Notice: Subject to any disclaimer, the term of this patent is extended or adjusted under 35 U.S.C. 154(b) by 330 days.

(21) Appl. No.: 14/460,054

(22) Filed: Aug. 14, 2014

(65) Prior Publication Data

US 2016/0049441 A1 Feb. 18, 2016

(51) Int. Cl.
*H01L 27/00* (2006.01)
*H01L 27/146* (2006.01)
*H01L 27/30* (2006.01)
*H01L 51/42* (2006.01)

(52) U.S. Cl.
CPC ... *H01L 27/14663* (2013.01); *H01L 27/14612* (2013.01); *H01L 27/14692* (2013.01); *H01L 27/14658* (2013.01); *H01L 27/308* (2013.01); *H01L 51/4293* (2013.01)

(58) Field of Classification Search
CPC .............. H01L 51/4293; H01L 27/308; H01L 27/14658; H01L 27/14663; H01L 27/14692; H01L 27/14612
See application file for complete search history.

(56) References Cited

U.S. PATENT DOCUMENTS

| 8,962,377 | B2* | 2/2015 | Shieh | .................. H01L 27/1225 257/292 |
| 9,240,437 | B2* | 1/2016 | Shieh | .................. H01L 27/3244 |
| 2012/0211063 | A1* | 8/2012 | Lee | .................. H01L 31/02244 136/255 |
| 2014/0167046 | A1* | 6/2014 | Shieh | .................. H01L 27/1225 257/53 |
| 2015/0263078 | A1* | 9/2015 | Shieh | .................. H01L 27/3244 438/23 |

* cited by examiner

*Primary Examiner* — Kimberly Rizkallah
*Assistant Examiner* — Alexander Belousov
(74) *Attorney, Agent, or Firm* — Robert A. Parsons; Michael W. Goltry; Parsons & Goltry

(57) ABSTRACT

A method of fabricating an X-ray imager including the steps of forming an etch stop layer on a glass substrate and depositing a stack of semiconductor layers on the etch stop layer to form a sensor plane. Separating the stack into an array of PIN photodiodes. Depositing a layer of insulating material on the array to form a planarized surface and forming vias through the insulating layer into communication with an upper surface of each photodiode and forming metal contacts on the planarized surface through the vias in contact with each photodiode. Fabricating an array of MOTFTs in an active pixel sensor configuration backplane on the planarized surface and in electrical communication with the contacts, to provide a sensor plane/MOTFT backplane interconnected combination. Attaching a flexible support carrier to the MOTFT backplane and removing the glass substrate. A scintillator is then laminated on the array of photodiodes.

20 Claims, 4 Drawing Sheets

Process (Support Substrate)

FLEXIBLE APS X-RAY IMAGER WITH MOTFT PIXEL READOUT AND A PIN DIODE SENSING ELEMENT

FIELD OF THE INVENTION

This invention generally relates to active matrix pixel sensor X-ray imagers using a MOTFT backplane and a PIN diode sensor array.

BACKGROUND OF THE INVENTION

There is a strong interest in using Metal Oxide Thin Film Transistors (MOTFT) as the active matrix backplane in digital X-ray imagers because of the higher mobility and stability of the MOTFTs. The high performance MOTFT enables an active pixel sensor (APS) configuration similar to silicon wafer based CMOS imagers. This is not possible with an amorphous silicon (a-Si) TFT backplane because of its poor mobility and Vth instability under operation. There is also a strong interest in having a flexible or conformable X-ray imager that can fit with the contours of the object being X-rayed. The key issue for such imagers is the MOTFT's compatibility with the X-ray image detector fabrication process.

One of the most popular X-ray image detectors is the X-ray scintillator/a-Si TFT/a-Si PIN photodiode combination. The X-ray scintillator converts the X-rays into visible light which is then detected by the a-Si PIN photodiode in an image sensing pixel of a two dimensional visible imager. Each sensing pixel comprises a switch transistor made of an a-Si TFT, a storage capacitor and a sensing element made of an a-Si PIN photodiode. Such pixel circuit is often called a passive pixel sensing (PPS) circuit. This combination is preferred because of its simple and inexpensive construction. In high pixel density and small pixel pitch designs, it is preferred to have the PIN photodiode plane on top of the TFT backplane so that the metal lines and transistors in the backplane will not block visible light coming from the X-ray scintillator. But unfortunately the fabrication of the a-Si PIN photodiode plane on top of (i.e. subsequent to) a MOTFT backplane can be an issue. Primarily, the MOTFT backplane will have a difficult time surviving the high temperature and the ambience of a-Si fabrication. In addition to a-Si based pin photodiodes, almost all high performance PIN photodiodes made with inorganic semiconductor materials are deposited at high temperatures and/or need post annealing at high temperature. The issue above is thus a general issue for an X-ray imager with a MOTFT-based back-panel circuit.

Because of this problem, the fabrication process is constrained to form the a-Si PIN photodiode plane first and then form the MOTFT backplane on top of the a-Si photodiode plane. The key problem in this orientation is that the metal lines and transistors in the MOTFT backplane will block a significant portion of the incident light from the top mounted scintillator. The fill factor (the ratio of sensing area to the total pitch area) for MOTFT backplanes is very poor. Also, the fill factor issue gets worse for high resolution imager arrays because of the smaller pixel size (i.e. higher pixels density). Another motivation for using MOTFT backplanes for digital X-ray imagers is to use the active pixel sensor (APS) pixel readout configuration which provides signal amplification at each imager pixel site. However, in APS configurations more metal lines and transistors are needed compared with passive pixel sensor (PPS) configurations. Thus, the fill factor is even worse for APS than for PPS. Furthermore, if circuit compensation techniques are used to compensate for stability and uniformity, more transistors and control lines are needed, which makes the fill factor problem even worse. Thus, it is very difficult to make a high resolution APS X-ray imager using the MOTFT backplane and PIN photodiode plane combination.

In a copending U.S. patent application entitled "Pixelated Imager with MOTFT and Process", filed Dec. 13, 2012, bearing Ser. No. 13/713,744, and incorporated herein by reference, the fabrication of rigid sensors is disclosed. Further, a wide variety of different sensors and displays are described.

It would be highly advantageous, therefore, to remedy the foregoing and other deficiencies inherent in the prior art.

Accordingly, it is an object of the present invention to provide a new and improved process for fabricating an X-ray image detector.

It is another object of the present invention to provide a new and improved process for fabricating an X-ray image detector incorporating the X-ray scintillator/PIN photodiode combination with a MOTFT backplane.

It is another object of the present invention to provide a new and improved process for fabricating an X-ray image detector with an active pixel sensor (APS) configuration.

It is another object of the present invention to provide a new and improved process for fabricating a flexible X-ray image detector.

It is another object of the present invention to provide a new and improved X-ray image detector incorporating an X-ray scintillator/PIN photodiode combination with a MOTFT backplane.

It is another object of the present invention to provide a new and improved flexible X-ray image detector incorporating an X-ray scintillator/PIN photodiode combination with a MOTFT backplane and an active pixel sensor (APS) configuration.

SUMMARY OF THE INVENTION

The desired objects of the instant invention are achieved in accordance with an embodiment of a method of fabricating an X-ray imager including the steps of providing a rigid support member with a surface, forming an etch stop layer on the surface of the rigid support member, and depositing sensing element blanket layers on the etch stop layer. The sensing element blanket layers are separated into an array of sensing elements. A layer of insulating material is deposited on the array of sensing elements to form a planarized surface and contacts are formed on the planarized surface in communication with individual sensing elements in the array through the layer of insulating material. A MOTFT backplane is positioned on the planarized surface and in electrical communication with the contacts to provide a sensor plane/MOTFT backplane interconnected combination. A support carrier is attached to the MOTFT backplane and the rigid support member is removed. A scintillator is laminated on the array of sensing elements.

The desired objects of the instant invention are also achieved in accordance with a specific embodiment thereof wherein an X-ray imager includes a stack of blanket layers of a-Si or compound semiconductor material including a first p or n doped layer, an intrinsic layer, and a second n or p doped layer, separated into an array of PIN photodiodes by isolation patterning on the top doped layer. A layer of insulating material is positioned on the array of PIN photodiodes forming a planarized surface that includes contacts on the planarized surface in electrical communication with individual photodiodes in the array through the layer of insulating material. An array of MOTFTs in a passive pixel sensor or an active pixel sensor configuration backplane is positioned on the planarized surface and in electrical communication with the contacts, to provide a sensor plane/MOTFT backplane interconnected combination. A flexible support carrier is positioned on the MOTFT backplane and a scintillator is laminated on the array of PIN photodiodes.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
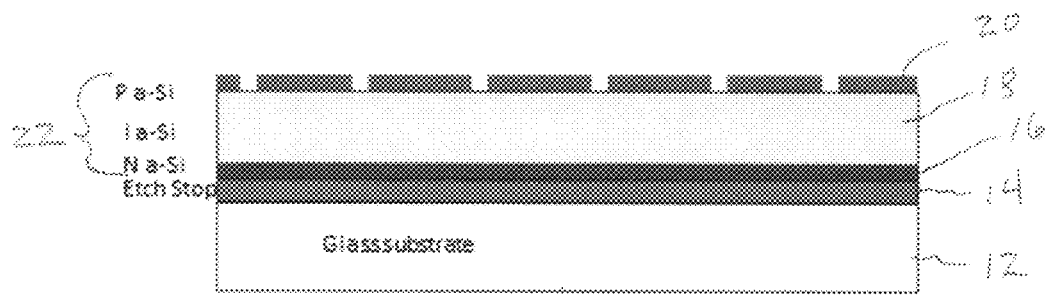
FIG. 1 is a simplified layer diagram illustrating a first intermediate structure in a process for fabricating X-ray imagers in accordance with the present invention.

In the specific embodiment illustrated in FIG. 1, a rigid support member (hereinafter glass substrate 12) includes a flat glass panel, which is a preferred support member and will be used as an example herein although other materials may be used in specific applications. It should also be understood that the thickness of glass substrate 12 is not critical except that it must be thick enough to prevent any bending during the fabrication process and will generally be as thin as practical to reduce the ultimate etching time. Also, glass substrate 12 (i.e. the rigid support member) should be easy to remove once the fabrication process has been completed.

An etch stop layer 14 is deposited on glass substrate 12 and includes any material that will stop the etching process once glass substrate 12 has been removed. As is known in the art, etching of glass substrate 12 is best performed by hydrofluoric acid (HF) and the best etch stop material is a thin layer of noble metal, such as Au, Pt, Pd, or a thin layer of transition metal in 5B and 6B columns of the periodic table, such as V, Nb, Ta, Cr, Mo, and W, and mixtures or multilayer stacks thereof. In some instances it may be desirable to enhance the adhesion of the layer of noble metal to overlying and underlying materials. Such enhancement can be provided by optional thin glue layers (not visible within layer 14) such as Cr, Ti, Ni, or mixtures thereof applied to the top and/or bottom of layer 14. It should be specifically noted that once glass substrate 12 is removed any noble metal (e.g. Au used in etch stop layer 14) can be recycled or reclaimed to reduce the cost.

Another option for etch stop layer 14 is a thin layer of amorphous silicon (a-Si) deposited on glass substrate 12 by PECVD. It should be noted that a-Si itself cannot survive the HF etch process. However, by thermally crystallizing the a-Si into poly-Si at a temperature above 500° C., the resulting poly-Si can survive the HF etch process. Since the crystallization step is carried out before any additional layer deposition and TFT processing, the high temperature step does not cause any problem. As is well known borosilicate type of glasses used in the flat panel industry can stand for temperature cycles to approximately 600° C. Such glass can withstand the polycrystalline process and has been used in the low temperature polysilicon (TPS) display industry.

Etch stop layer 14 should be as thin as possible to reduce the time required for application and removal if required or preferred. It has been found that a thickness of less than 200 nm provides sufficient protection and, preferably, etch stop layer 14 is 100 nm or thinner. Here it should be noted that in the prior art, (U.S. Pat. No. 8,258,694, which uses an insulating protection layer to prevent etching components above the etch stop layer) even with the glass substrate having an etching selectivity 20 times greater than the insulating protection layer, the insulating protection layer would have to be much thicker than 200 nm to withstand the etching removal of the glass substrate.

A first semiconductor layer 16 is deposited on etch stop layer 14 and may be either n or p type conductivity. A layer 18 of intrinsic semiconductor material is deposited on layer 16 and a layer 20 of opposite conductivity material (i.e. p or n) is deposited on layer 18. It will be understood that the three layers form a sensing element plane or in this case a PIN diode detector (photodiode) plane, generally designated 22, which is a preferred embodiment for its efficiency. However, if simple p/n diodes are sufficient, intrinsic layer 18 can simply be omitted. In either process, layers 16, 18, and 20 are p-i-n photodiode blanket layers, or sensing element blanket layers, deposited over etch stop layer 14 and no masks are required. In one preferred embodiment, all three layers 16, 18, and 20 are formed with one semiconductor material, such as amorphous silicon, a-Si, (as shown marked in FIG. 1) or amorphous germanium, a-Ge, (not shown) or their alloy, for the simplicity of formation and the sensitivity to visible light.

In another preferred embodiment, the doped and intrinsic semiconductor layers 16, 18, and 20 are formed with different compound semiconductor films such that a heterojunction photodiode is formed. Such arrangement can be used to reduce the dark current and optimize photodetectivity. Examples of heterojunction type of PIN diodes include oxygen deficient Zn—O, In—Zn—O, Ti—O, Ta—O, W—O, or Zr—O film for the n-layer, Cd—S, Cd—O, Cu—O, Cu—S, Cu—In—O, Cu—In—Se, Cu—In—S, Cu—Cd—O, Cu—Cd—Se, Cu—Cd—S, Cu—Ga—O, Cu—Ga—Se, Cu—Ga—S, Cu—In—Ga—Se, or Cu—In—Ga—S, for the i-layer, Mo—O, $Ag_xMoO_{3-x}$, and/or $AgAlO_3$ for the p-layer. The i-layer can also be made in multiple sub-layers for special needs or to optimize hole and electron extractions at the corresponding contact electrodes. Doped layers 16 and 20, when provided with a wider semiconductor energy gap, can reduce the dark current under reverse bias and thus reduce the sensor noise and increase the detectivity of the sensor array. Doped layers 16 and 20 are especially useful in APS circuits when used for a pixel readout circuit and, when the system noise is improved, to level the imaging sensitivity, which is limited by a noise PIN sensing element in each pixel.

The carrier densities in the p or n doped layers are typically larger than $10^{17}$ cm$^{-3}$, and, preferably, larger than $10^{18}$ cm$^{-3}$. The carrier density in the intrinsic or i-layer is typically smaller than $10^{16}$ cm$^{-3}$, and, preferably, smaller than $10^{15}$ cm$^{-3}$. In certain applications the PIN structure is patterned into individual pixels by etching upper layer 20 as illustrated in FIG. 1. In certain applications with small pixel gap between neighboring pixel pads, lateral charge dispersion needs to be further controlled, both layer 20 and part or all of layer 18 are etched within each image pixel (not shown in FIG. 1).

In FIG. 1, layer 16 is denoted as an n-type a-Si layer and layer 20 is denoted as a p-type a-Si layer. In practice, the order can be reversed. Selection is often made to match the convenience and the simplification of the readout circuits in each pixel and in peripheral areas of the image array.

Although a-Si is illustrated in FIG. 1 as the PIN sensor element, part or all of the layers 16, 18 and 20 can also be in nano-crystalline or micro-crystalline forms.

Figure 2:
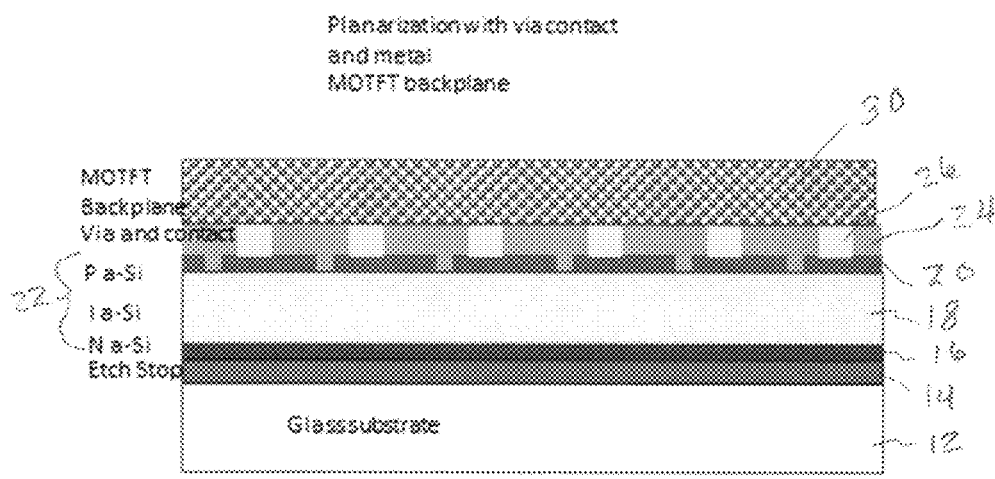
FIG. 2 is a simplified layer diagram illustrating a second intermediate structure in a process for fabricating X-ray imagers in accordance with the present invention.

Referring to FIG. 2, an insulating planarization layer 24 is deposited over patterned layer 20 by any convenient process and using any suitable insulating material. It could be made with organic material, inorganic material, or combinations thereof in blend form or in stack with multiple sublayers. Examples for organic insulator material for layer 24 include photo-patternable organic polymers, such as epoxy based SU-8 by MicroChem, polyimide (such as Toray 4100 series or 1600 series, JNC PIF-series), positive acryl resin such as JSR PC548, AZ SOG series, silane or siloxane based photo patternable polymers (such as Fuji FF series and JNC silamax series). Inorganic insulator materials for layer 24 include SiN, SiON, and SiO. They could be made by PECVD, CVD, atomic layer deposition, sputter, or a coating process from a solution based precursor. In one preferred embodiment, layer 24 is formed in an inorganic/organic bilayer, with 50 nm-500 nm thick for the inorganic insulator layer and 100 nm-200 nm thick for the organic insulator layer. Vias 26 are formed through insulating planarization layer 24 and electrically conductive contacts are formed through vias 26 into electrical contact with the upper surface of individual photodiodes through insulating planarization layer 24. In the case where layer 24 is made with an inorganic/organic bilayer, the via-hole pattern in layer 24 can be achieved by a standard photo-exposure process when the organic insulator is directly photo-patternable. Via-holes 26 are formed in the organic layer after developing. These holes are used as a built-in mask and the inorganic insulator layer in the via-hole area can be removed with a dry-etching process. A MOTFT backplane 30 is fabricated directly or otherwise positioned on insulating planarization layer 24 and in electrical contact with PIN diodes in plane 22 through vias 26. In practice, the via 26 process can be combined with one of the metal layer processes in MOTFT 30. The process is thus further simplified. In a preferred embodiment, MOTFT backplane 30 is an active pixel sensor which, because light enters the structure through the bottom, will not hinder or otherwise reduce the sensitivity.

A typical APS pixel readout comprises three TFTs, one storage capacitor and several control/power lines. Such APS pixel readout has been used in silicon-wafer based CMOS imagers (Z. Huang and T. Ando, "A novel amplified image sensor with a-Si:H photoconductor and MOS transistor", *IEEE Trans. Electron Devices*, Vol. 37, p. 1432 (1990)). For large size image arrays for X-ray and other applications, a wafer based pixel readout is too expensive to use. A TFT based back-panel becomes the only viable solution. Amorphous silicon TFTs have been used for PPS readouts for X-ray imagers (Larry E, Antonuk et al., "Large-Area Flat-Panel Amorphous Silicon Imager", *Proc. SPIE.*, V. 2432, p. 216 (1995)).PPS readout becomes challenging to be used when pixel pitch and sensor pad dimension is reduced to levels below 100 mm×100 um, at which the photo-response under X-ray illumination is reduced to levels comparable to various noises existing in the sensor system. In view of the above, an APS pixel readout becomes a promising approach. High pixel density APS pixel readout with thin-film-transistors can be arranged in stack relationship over the sensing element 22. An amorphous silicon TFT is limited for such application due to its low mobility (and thus limited space for pixel readout) and operation stability. LTPS-TFT is difficult to use for its high fixed pattern noise due to performance inhomogeneity. High performance metal-oxide thin film transistors (MOTFT) developed recently provide a unique solution for such APS image arrays. The MOTFT has mobility and operation stability as good as the LTPS-TFT (over 80 cm$^2$/Vsec and over 100 coulomb electrons passing the TFT without performance change), but with Vth and ON current uniformity as good as amorphous silicon TFTs. Active matrix organic light emitting displays (AMOLED) was demonstrated with a two transistor and one capacitor pixel circuit which confirmed the Vth and Ion uniformity (G. Yu et al., "Digest of Information Display", *SID Symposium Digest*, Vol. 42, p. 483, (2011); U.S. Pat. No. 7,812,346, entitled "Metal Oxide TFT with Improved Carrier Mobility", issued Oct. 12, 2010; U.S. Pat. No. 8,679,905, entitled "Metal Oxide TFT With Improved Source/Drain Contacts", issued Mar. 25, 2014; Copending U.S. patent application Ser. No. 13/536,641; and Copending U.S. patent application Ser. No. 13/902,514). In addition to the high mobility and operation stability, the MOTFT possesses superb low "OFF" current under reverse Vgs bias, often reaching the limit of testing equipment. Tests with a MOTFT with channel width of W=10000 microns and channel length of L=5 microns revealed that $I_{off}$ is independent of Vgs (for Vgs<Vth) and Vds at a level of 0.1 fA/μm. The 'OFF' current in a MOTFT with W=3 μm and L=5 μm is thus at a level of 0.3 fA (~2000 electrons). The corresponding quantum noise is thus smaller than 50 electrons. The 'ON' current in the same TFT is over 10 microamps for Vge>+5V and Vds=5V, the current switch ratio in such a TFT is over $10^{10}$ (G. Yu et al., "Digest of Society of Information Display", *SID Symposium Digest*, Vol. 43, p. 1123, (2012)). Such high switch ratio TFT has not been seen in the thin film transistor field, which enables an image array with a video rate, with 2D array comprising more than 1000×1000 pixels (i.e., >105 gate lines), with large dynamic range and with noise level only achieved with single crystalline silicon CMOS arrays.

The APS pixel readout circuit bares similar performance requirement as the 2T1C AMOLED pixel driver. The TFT operating under analog model in both cases requires high uniformity and stability on operation current and threshold voltages. The uniformity performance demonstrated in AMOLED thus validates the MOTFT described above for APS image arrays.

Such a MOTFT backplane can be fabricated over the PIN photodiode array 22 of FIG. 2 at a temperature and an environment compatible to the underlying sensor array: i.e., without damage to the sensor array. Since the APS readout is stacked behind the PIN sensor array and light illumination from X-ray scintillator from the bottom (see FIG. 4), the entire pixel pitch area can be used for APS pixel readout circuits. Typical APS readout in three transistor and one capacitor form can be laid out within a 20 μm×20 μm area, which corresponds to a pixel density of 1250 pixels per square inch.

Figure 3:
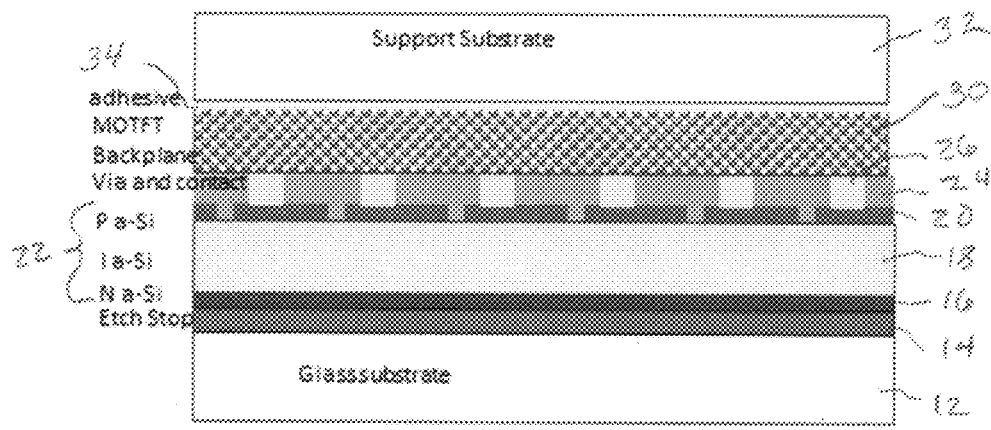
FIG. 3 is a simplified layer diagram illustrating a third intermediate structure in a process for fabricating X-ray imagers in accordance with the present invention.

After PIN diode plane 22 and MOTFT backplane 30 are fabricated, additional packaging structure is formed on the upper surface thereof as illustrated in FIG. 3. While the additional packaging structure can be either flexible or ridged, in this specific example the additional packaging structure is a flexible plastic carrier 32. Flexible plastic carrier 32 is thick enough to act as the mechanical support for the X-ray sensor device after glass substrate 12 is removed. Also, the top side of the X-ray sensor device is protected by flexible plastic carrier 32. In most instances a coating 34 of adhesive material (e.g. glue or the like) is applied to the upper surface of MOTFT backplane 30 to fixedly attach flexible plastic carrier 32 thereto. In applications requiring high barrier properties for plastic carrier 32, a barrier coating at the interface between carrier 32 and coating 34 or at both surfaces of carrier 32 can be added.

With flexible plastic carrier 32 fixedly attached to MOTFT backplane 30, glass substrate 12 can be removed. For the removal process the whole structure is put into an HF bath with proper agitation. If flexible plastic carrier 32 is not resistant to HF (hydrofluoric acid), the sides and top of the package can be protected by an additional resist material, generally one that is easily removed after glass substrate 12 has been removed. Once glass substrate 12 is removed, etch stop layer 14 can be removed by a different etching process if required. For example, when Au or other metal is used as etch stop layer 14 it blocks light from PIN diode plane 22 and, in addition, will save money by removing and reusing the material. When etch stop layer 14 is a thin poly-silicon film it is generally transparent to light emission and may simply be left in place. However, since some light may be blocked it is or may be preferable to remove the poly-silicon layer. When removing is desirable, the poly-silicon can be removed by fluorine based dry etching. Since packaging and glass substrate removal are carried out at low temperatures (<100 degrees Celsius), the present novel process allows more options in material selection for flexible plastic carrier 32.

Figure 4:
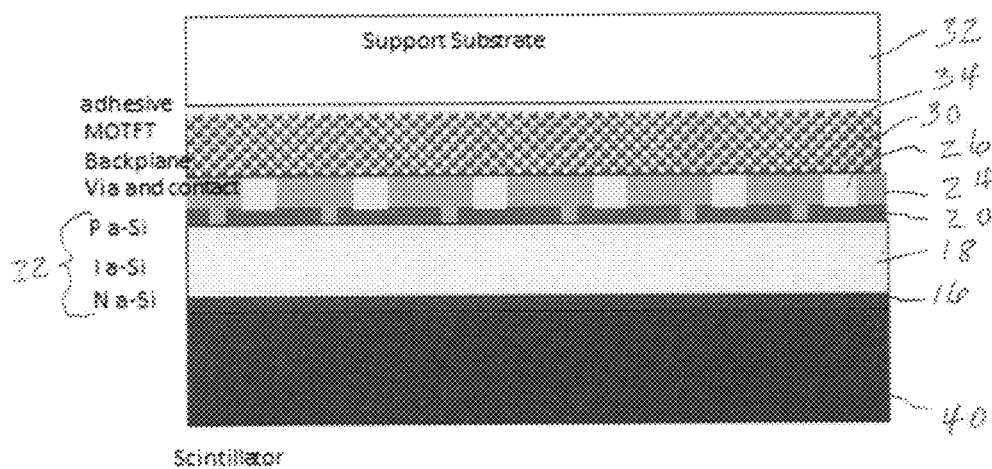
FIG. 4 is a simplified layer diagram illustrating a final embodiment for a flexible improved X-ray image detector incorporating an X-ray scintillator/a-Si photo diode combination with a MOTFT backplane in accordance with the present invention.

Turning to FIG. 4, once flexible plastic carrier 32 is attached and glass substrate 12 is removed, a scintillator layer 40 is laminated to the structure from the backside as illustrated. Scintillator layer 40 can include any of the well-known materials that convert X-rays to visible light. Layer 40 can be made into either flexible or predefined, non-flat conformable forms (examples include structured crystalline scintillator such as CsI:Tl, or scintillator particles in a polymer binder, such as $Gd_2O_2S$:Tb). Methods have been known to experts in the field. The resulting structure is a flexible or conformable X-ray image detector in which the higher mobility and stability of the MOTFTs and greater resolution through smaller pixels is or can be realized. Also, the use of an active pixel sensor configuration greatly improves sensitivity, readout frame time, dynamic range and control of the X-ray image detector. For example, some amplification of the sensed signals can be incorporated into the APS configuration to a level above the noise of the readout data line. The stacking configuration and the high $I_{on}/I_{off}$ ratio in a MOTFT with dimensions reaching design rules enables the APS pixel readout with signal amplifier with desired magnification factors: thus, APS with variable gains is realized. Another example is incorporating a reset or a compensating circuit in the pixel readout to further improve the operation stability or responding speed and minimizing signal processing time by software in a computer system. High image quality, large dynamic range, video rate, X-ray imager can be achieved with such an image array.

The flexible/conformable image array disclosed in this invention enables many applications never achieved before. The APS pixel readout improves the X-ray detection sensitivity to levels only previously achieved with single crystal silicon wafer based CMOS imagers. The sensor structure shown in FIG. 4 enables large area sensor arrays to be made into, for example, cylindrical form and fits the need for tomo-synthesis and cone beam X-ray CT. Such a cylindrical array possesses uniform pixel/angle ratio and eliminates complicated image reconstruction calculations by software after a CT scan. The high mobility MOTFT and fast frame time X-ray sensing enables real time diagnostic or monitoring/inspection during surgeon operations. The applications can go beyond the medical field and into industrial X-ray inspection. Examples include defect inspection in oil pipes and frame structure inspection of airplane or sailing boats.

Thus, the present invention provides new and improved processes for fabricating a flexible/comformable X-ray image detector incorporating the X-ray scintillator/PIN photo diode combination with a MOTFT backplane. The new and improved processes for fabricating an X-ray imager use a fewer number of process steps which are simple to perform. Also, the new and improved processes for fabricating an X-ray imager are specifically designed to make the fabrication of the PIN photo diode plane compatible with the fabrication of the MOTFT backplane and the lamination of the scintillator thereon. Further, the processes result in the formation of a flexible/conformable X-ray image detector that can more easily fit with the contours of the object being X-rayed. Because the process allows the combination of the MOTFT backplane and the PIN diode plane, the higher mobility and stability of the MOTFTs and greater resolution through smaller pixels and the use of an active pixel sensor configuration with amplification if desired greatly improves the sensitivity, dynamic range, frame time and control of the X-ray image detector.

In addition to rigid glass as supporting substrate 12, a flat metal sheet (such as aluminum, copper, stainless steel) can be used. Such metal supporting sheet can be removed by wet etching.

The imager structure and the corresponding process flow disclosed in this invention can be extended beyond X-ray or radiation image arrays. For example, by replacing the scintillator layer 40 with a cylindrical optical lens or a lens system or a micro-lens array, or a Fresnel lens array with cylindrical function, a curved image array with a large field of view and with uniform pixel/view angle ratio can be achieved. The high mobility, high current switch ratio MOTFT enables high pixel density, high pixel count image array with high sensitivity and fast image readout with high frame rate. The constant pixel/view angle ratio enables uniform image readout over large view angles without image distortion. It also eliminates tedious image correction post image collection with software with wafer-based flat camera or a set of flat cameras.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating an X-ray imager comprising the steps of:
    providing a rigid support member with a surface;
    forming an etch stop layer on the surface of the rigid support member;
    depositing sensing element blanket layers on the etch stop layer;

separating the sensing element blanket layers into an array of sensing elements;
depositing a layer of insulating material on the array of sensing elements to form a planarized surface;
forming contacts on the planarized surface with individual sensing elements in the array through the layer of insulating material;
positioning a MOTFT backplane on the planarized surface and in electrical communication with the contacts, to provide a sensor plane/MOTFT backplane interconnected combination;
attaching a support carrier to the MOTFT backplane;
removing the rigid support member; and
laminating a scintillator on the array of sensing elements.

2. A method as claimed in claim 1 wherein the step of depositing sensing element blanket layers on the etch stop layer includes depositing multiple semiconductor layers, forming a PIN photodiode plane.

3. A method as claimed in claim 2 wherein the step of forming the PIN photodiode plane includes process temperatures higher than process temperatures included in the step of positioning the MOTFT backplane.

4. A method as claimed in claim 2 wherein the step of depositing sensing element blanket layers, the multiple semiconductor layers include at least one of amorphous silicon, amorphous germanium, and amorphous selenium.

5. A method as claimed in claim 2 wherein the step of depositing sensing element blanket layers, the multiple semiconductor layers comprise compound semiconductor materials including at least one of Zn—O, In—Zn—O, Ti—O, Ta—O, W—O, Zr—O, Cd—S, Cd—O, Cu—O, Cu—S, Cu—In—O, Cu—In—Se, Cu—In—S, Cu—Cd—O, Cu—Cd—Se, Cu—Cd—S, Cu—Ga—S, Cu—Ga—O, Cu—Ga—Se, Cu—In—Ga—Se, Cu—In—Ga—S, Mo—O, $Ag_xMoO_{3-x}$, and combinations in blend or in stack form.

6. A method as claimed in claim 1 wherein the step of depositing sensing element blanket layers on the etch stop layer includes depositing a first p or n doped layer, an intrinsic layer, and a second n or p doped layer, forming a PIN photodiode plane.

7. A method as claimed in claim 6 wherein the step of separating the sensing element blanket layers into an array of sensing elements includes patterning the second n or p doped layer to define individual PIN photodiodes.

8. A method as claimed in claim 7 wherein the step of separating the sensing element blanket layers into an array of sensing elements includes further patterning the intrinsic layer to define individual PIN photodiodes.

9. A method as claimed in claim 1 wherein the step of depositing a layer of insulating material includes depositing material including one of organic or inorganic insulating material including SU-8, polyimide, JSR PCS548, AZ SOG series, silane or siloxane based photo-patternable polymers, SiN, SiON, $SiO_x$, or combinations thereof in blend form or in stack multiple sublayers.

10. A method as claimed in claim 9 wherein the step of depositing the layer of insulating material including one of organic or inorganic insulating material includes depositing an inorganic sublayer in contact with the PIN sensing elements and a photo-patternable organic insulator layer in contact with the MOTFT backplane.

11. A method as claimed in claim 1 wherein the step of forming the etch stop layer includes forming a layer including one of a noble metal and poly-Si.

12. A method as claimed in claim 11 wherein the step of forming the etch stop layer including one of a noble metal and poly-Si includes forming the etch stop layer with a thickness of less than 200 nm.

13. A method as claimed in claim 1 wherein the step of forming contacts on the planarized surface includes forming vias through the layer of insulating material and introducing metal contacts through the vias.

14. A method as claimed in claim 1 wherein the step of positioning the MOTFT backplane on the planarized surface includes fabricating an array of MOTFTs in an active pixel sensor configuration.

15. A method as claimed in claim 14 wherein the step of fabricating the array of MOTFTs in the active pixel sensor configuration includes forming each active pixel sensor with signal amplification.

16. A method as claimed in claim 1 wherein the step of attaching the support carrier includes attaching a flexible support carrier.

17. A method as claimed in claim 1 wherein the step of providing the rigid support member includes providing a glass substrate.

18. A method as claimed in claim 17 wherein the step of removing the rigid support member includes etching the glass substrate using HF.

19. A method as claimed in claim 1 further including a step of removing the etch stop layer subsequent to the step of removing the rigid support member.

20. A method of fabricating an X-ray imager comprising the steps of:
providing a glass substrate with a surface;
forming an etch stop layer including one of a noble metal and poly-Si on the surface of the glass substrate;
depositing a stack of elemental or compound semiconductor layers on the etch stop layer, the stack including a first p or n doped layer, an intrinsic layer, and a second n or p doped layer, forming a PIN photodiode plane;
separating the stack of semiconductor layers into an array of PIN photodiodes;
depositing a layer of insulating material on the array of sensing elements to form a planarized surface and forming vias through the planarizing layer into communication with an upper surface of each PIN photodiode in the array of PIN photodiodes;
forming metal contacts on the planarized surface and through the vias in contact with the upper surface of each PIN photodiode in the array of PIN photodiodes;
fabricating an array of MOTFTs in an active pixel sensor configuration backplane on the planarized surface and in electrical communication with the contacts, to provide a sensor plane/MOTFT backplane interconnected combination;
attaching a flexible support carrier to the MOTFT backplane;
removing the glass substrate; and
laminating a scintillator on the array of PIN photodiodes.

* * * * *